(12) United States Patent
Hsieh et al.

(10) Patent No.: US 6,860,138 B1
(45) Date of Patent: Mar. 1, 2005

(54) REAL-TIME DETECTION MECHANISM WITH SELF-CALIBRATED STEPS FOR THE HARDWARE BASELINE TO DETECT THE MALFUNCTION OF LIQUID VAPORIZATION SYSTEM IN AMAT TEOS-BASED DXZ CHAMBER

(75) Inventors: Chung-Ju Hsieh, Taipei (TW); Hsi-Wen Liao, Nantou (TW); Kai-Hsin Liu, Taipei (TW); Tsu-Kuang Hou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 54 days.

(21) Appl. No.: 10/082,024

(22) Filed: Feb. 21, 2002

(51) Int. Cl.[7] .................. G01F 25/00; H01L 21/66; C30B 25/14; C30B 25/16
(52) U.S. Cl. .................. 73/1.36; 427/8; 427/255.28; 438/5; 438/14; 117/85; 117/86; 117/93; 117/102
(58) Field of Search .................. 73/1.35–1.36, 73/1.31; 427/8, 248.1, 255.23, 255.28, FOR 102; 118/712, 715, 900; 438/5, 14, 935, FOR 141, FOR 142; 261/128, 135; 117/85–86, 93, 102, 201–202

(56) References Cited

U.S. PATENT DOCUMENTS

| | | | |
|---|---|---|---|
| 4,069,948 A | * | 1/1978 | Saoty et al. .................. 73/1.36 |
| 4,341,107 A | * | 7/1982 | Blair et al. .................. 73/1.34 |
| 4,671,097 A | * | 6/1987 | Kurki et al. .................. 73/1.34 |
| 5,531,183 A | | 7/1996 | Sivaramakrishnam et al. ... 117/93 |
| 5,645,642 A | * | 7/1997 | Nishizato et al. ........ 118/712 X |
| 5,866,795 A | * | 2/1999 | Wang et al. .................. 73/1.36 |
| 5,925,189 A | | 7/1999 | Nguyen et al. ............. 118/726 |
| 5,948,958 A | * | 9/1999 | Bang et al. .................. 73/1.36 |
| 5,968,588 A | * | 10/1999 | Sivaramakrishnan et al. .. 427/8 |
| 6,117,571 A | * | 9/2000 | Baum et al. ................. 428/697 |
| 6,179,277 B1 | | 1/2001 | Huston et al. .............. 261/128 |
| 6,218,268 B1 | * | 4/2001 | Xia et al. .................... 438/435 |
| 6,409,837 B1 | * | 6/2002 | Hillman ...................... 118/712 |
| 6,541,063 B1 | * | 4/2003 | Prentice et al. ................ 427/8 |
| 2003/0196680 A1 | * | 10/2003 | Lee et al. .................... 134/1.1 |
| 2004/0007176 A1 | * | 1/2004 | Janakiraman et al. ....... 118/715 |

* cited by examiner

*Primary Examiner*—Thomas P. Noland

(57) ABSTRACT

A method of preventing the scrapping of semiconductor substrates due to improper deposition of thin films in a thin film vaporization system is disclosed. This is accomplished by providing a method of self-calibrating and testing the flow of liquid precursors in the vaporization system prior to the start of the deposition process. The vaporization of the liquid precursor in the deposition chamber and the concomitant pressure change in the chamber are correlated. This correlation is then used as a real time monitoring mechanism for self-calibrating and testing the flow of liquid precursors through the vaporization system. That the pressure change due to vaporization in the chamber is used as the key parameter, the thin film deposition is hence monitored by that parameter which directly predicts the film deposition characteristics. Consequently, each thin film run is assured of a successful run.

20 Claims, 5 Drawing Sheets

FIG. 1 – Prior Art

TABLE I

| He 800; sccm | TV=fully open | |
|---|---|---|
| TEOS Flow (mgm) | CHA Pressure (torr) | CHB Pressure (torr) |
| 900 | 0.468 | 0.487 |
| 850 | 0.468 | 0.483 |
| 800 | 0.462 | 0.481 |
| 750 | 0.459 | 0.477 |
| 700 | 0.456 | 0.474 |
| 650 | 0.456 | 0.471 |
| 600 | 0.453 | 0.468 |
| 550 | 0.449 | 0.468 |
| 500 | 0.449 | 0.466 |

TABLE II

| He 800 sccm | TV = self calibration | |
|---|---|---|
| TEOS Flow (mgm) | CHA Pressure (torr) | CHB Pressure (torr) |
| 900 | 7.54 | 7.52 |
| 850 | 7.41 | 7.34 |
| 800 | 7.23 | 7.2 |
| 750 | 6.95 | 6.9 |
| 700 | 6.67 | 6.54 |
| 650 | 6.42 | 6.33 |
| 600 | 6.17 | 6.06 |
| 550 | 5.88 | 5.8 |
| 500 | 5.59 | 5.49 |

TABLE III

| STEP | 1.<br>self<br>cal | 2.<br>TV<br>stable | 3.<br>TEOS<br>stable | 4.<br>vapor-<br>ization | 5.<br>stop<br>TEOS | 6.<br>pump |
|---|---|---|---|---|---|---|
| CHAMBER SEL | A.B.C.D... | A.B.C.D... | A.B.C.D... | A.B.C.D... | A.B.C.D... | A.B.C.D... |
| STEP. CONTROL | by time | by time | by time | by pressure >7 torr | by time | by time |
| STEP TIME(SEC). MAX | 10.0 | 5.0 | 8.0 | 5.0 | 2.0 | 10.0 |
| ENDPOINT. SELECT | no EP | no EP | no EP | no EP | no EP | no EP |
| PRESSURE. torr | 3.0 torr | TV: as before | TV: as before | TV: as before | TV: full open | TV: full open |
| RF POWER. RF2 POWER(W) | 0.0 | 0.0 | 0.0 | 0.0 | 0.0 | 0.0 |
| HEATER TEMP. deg C | 400 | 400 | 400 | 400 | 400 | 400 |
| GAS NAME & FLOW (sccm) | He, 800 sccm | He, 800 sccm | He, 800 sccm TEOS, 900 mgm | He, 800 sccm TEOS, 900 mgm | He, 800 sccm | - - - |
| HEATER SPACING | 290 mils | 290 mils | 290 mils | 290 mils | 290 mils | 290 mils |

FIG. 5

REAL-TIME DETECTION MECHANISM WITH SELF-CALIBRATED STEPS FOR THE HARDWARE BASELINE TO DETECT THE MALFUNCTION OF LIQUID VAPORIZATION SYSTEM IN AMAT TEOS-BASED DXZ CHAMBER

BACKGROUND OF THE INVENTION (1) Field of the Invention

The present invention relates to the manufacture of semiconductor devices, and in particular, to a real-time monitoring of vaporization and liquid flow rate of precursor liquid components used in the formation of thin films on semiconductor substrates in an AMAT TEOS-based Dxz Chamber.

(2) Description of the Related Art

It is common practice to process thin films in chambers manufactured by Applied Materials, Inc., (AMAT). These chambers provide various controls in order to achieve stable operations such as having uniform thickness and topography of the resultant films. As is described more in detail below, factors contributing to the stability of the properties of the films include the flow rate of the precursor liquids that are vaporized to deposit the desired films on a substrate, as well as the continual vaporization process. It has been the experience in the present manufacturing line that it is difficult to detect a malfunction in the vaporization process with the AMAT TEOS-based Dxz Chamber, and, therefore, a real-time monitor mechanism has been developed which is disclosed later in the embodiments of the present invention.

In U.S. Pat. No. 5,531,183 by Sivaramakrishnam, et al., issued to Applied Materials, Inc., a vaporization sequence is disclosed for multiple liquid precursors used in semiconductor thin film applications. This sequence is formulated in order to reduce the temperature sensitivity of the respective liquid precursors in either the vapor or liquid state. The need for such a sequence is described because of the nature of processing thin films as follows:

Liquid source precursors or components are often used in processing thin films, such as, for example, silicon oxide films. These liquids are typically stored in source tanks and a re delivered as vapors to a deposition chamber using a delivery system wherein each liquid flows through a separate line and liquid flow meter (to provide individual control of the flow rate of each reactant) and then is injected as a vapor into a common manifold. The vapors flowing in the manifold are then introduced into processing chamber connected to the manifold downstream of the points of entry of the gases and vaporized liquid source precursors into the manifold.

While the vaporous components, upon entering the processing chamber, perform satisfactorily, for example to form a thin film on a semiconductor substrate, it has been found that problems of either condensation of the previously vaporized liquid source component(s) or boiling of the still liquid component(s) in the delivery system can occur, depending upon the temperatures maintained at various points in the delivery system, including along the manifold. For example, if the temperature at a particular point along the manifold is too low (a cold spot), condensation of a previously vaporized liquid precursor source or component may occur at that point in the manifold. On the other hand, maintenance of too high a temperature in the manifold (to prevent such undesirable condensation) can result in boiling/decomposition of a liquid component in the liquid supply line of the particular liquid component upstream of its vaporization and injection into the manifold. This, in turn, can lead to instabilities in the flow rate control of that particular component due to fluctuations of the liquid flow meter as the boiling or near boiling component flows through it.

For example, Sivaramakrishnam, et al., describe that in the formation of a thin film of silicon oxide on a semiconductor substrate for use as a planarization layer, the silicon oxide is usually doped with phosphorus and/or boron to enhance the flow characteristics of the silicon oxide during a subsequent planarization step. This results in the use of a liquid silicon source precursor, such as an alkoxysilane, e.g., tetraethylorthosilicate (TEOS), a liquid phosphorus source precursor such as, for example, trimethylphosphite (TMP), triethylphosphite (TEP), or triethylphosphate (TEPO); and/ or a liquid boron source precursor such as, for example, trimethylborate (TMB) or triethylborate (TEB).

Following Sivaramakrishnam, in a vaporization system such as shown in FIG. 1, these liquids are stored in separate source tanks ((10a), (10b), (10c)) and are delivered as vapors to a deposition chamber using a delivery system wherein the liquid sources of silicon, phosphorus, and boron flow through separate lines ((20a), (20b), (20c)), liquid flow meters ((30a), (30b), (30c)) into valves ((40a), (40b), (40c)) and then are respectively injected as vapors into a common manifold (50) where they are usually mixed with a carrier gas from its own tank (60) flowing through its own flow meter (63) and valve (65) into the common manifold, which in turn leads the mixture to distribution nozzle (55) in the chamber. The vapors flowing in the manifold are then further mixed with a vapor source of oxygen in tank (70), usually just prior to entry into deposition chamber (80) to avoid premature reaction, to form the doped silicon oxide film on the semiconductor substrate (90) held on a heated holding fixture (85) in the deposition chamber. Typically the reaction may be either a thermal CVD reaction or a plasma-enhanced CVD reaction. The presence of the dopants in the resulting silicon oxide film lowers the temperature at which the silicon oxide film may be subsequently reflowed to produce a planarized film.

While the vaporous components, such as the reactants described above, react in a deposition chamber to form a satisfactory doped silicon oxide film useful for planarization of a structure formed on a semiconductor substrate, Sivaramakrishnam, et al., report that problems of either condensation or boiling in the delivery system can occur. As described above, if the temperature at a particular point along the manifold is too low, condensation of a previously vaporized reactant may occur at that point in the manifold, while maintenance of too high a temperature in the manifold can result in boiling/decomposition of a liquid precursor in the liquid supply line of that reactant upstream of its vaporization and injection into the manifold, resulting in erratic flow of the liquid precursor through the liquid flow meter.

The resultant instabilities in the flow rate of the reactants, due to either problem, can interfere with the satisfactory formation of a homogeneous product such as a properly doped silicon oxide film. For example, in the above described formation of a phosphorus and/or boron-doped silicon oxide film, premature condensation can effect incorporation of one or more of the dopants into the film, as well as effecting the uniform distribution of the dopant(s) in the silicon oxide film. Additionally, each microlayer of the thin film of silicon oxide could incorporate different concentrations of the respective dopants if the vaporization rates and flow into the processing chamber are not uniform.

It is, therefore, suggested by Sivaramakrishnam, that it would be advantageous to design a component delivery system used in the processing of thin films on semiconductor substrates, and in particular a component delivery system which utilizes liquid precursors, which would reduce the temperature sensitivity of the respective components in either the vapor or liquid state.

Another U.S. Pat. No. 6,179,277 by Huston of AMAT provides for improved liquid vaporizer systems and methods for their use. Vaporizer systems of the invention are particularly useful for the vaporization of liquids having a relatively low vapor pressure, such as tetrakisdiemthylamidotitanium (TDMAT). In one embodiment, a liquid vaporizer system includes a vaporizer unit having first and second inlets and an outlet. The vaporizer system further includes a vessel having an inlet and an outlet, whereby the vessel inlet is operably connected to the vaporizer outlet. The vessel contains a plurality of passages which operably connect the vessel inlet and the vessel outlet. In this manner, liquids and/or gases flowing into the vaporizer unit through either or both of its two inlets, exit the vaporizer unit outlet and enter the vessel inlet. Liquids and/or gases pass through the plurality of passages and exit the vessel outlet. In this manner, heating vaporizer unit and vessel to desired temperatures results in the vaporization of the liquid, such as liquid TDMAT.

Another apparatus by AMAT, namely, a liquid phosphorous precursor delivery apparatus is described in U.S. Pat. No. 5,925,189 by Nguyen et al., where the invention recognizes that the build-up of residue in a metal alloy injection valve used to inject a liquid phosphorous precursor compound is due to the nickel in the alloy affecting the liquid phosphorous precursor compound. The invention thus provides components manufactured of an alloy having a low nickel content, preferably less than 5% nickel, and more preferably less than 1%. In an additional aspect of the invention, the alloy is provided with a higher chromium content, preferably at least 15% chromium, more preferably 16–27%.

As these vaporizer, or, vaporization, systems are used for the important function of depositing thin films on wafers, what is needed is a method for quickly assessing the quality of the vaporization process and assuring that full vaporization takes place in the system so that thin films of required properties are obtained, and scrapped wafers are avoided as a result.

SUMMARY OF THE INVENTION

It is therefore an object of the present invention to provide a method of self-calibrating a thin film vaporization system.

It is another object of the present invention to provide a method of real time monitoring the liquid vaporization process in a thin film vaporization system.

It is still another object of the present invention to provide a method of determining the relationship between the pressure rise of a thin film depositing chamber and the flow rate of a liquid precursor in a thin film vaporization system.

It is yet another object of the present invention to provide a method of using the relationship between the chamber pressure and the liquid flow rate to determine any malfunction in the operation of a thin film vaporization system.

It is an overall object of the present invention to provide a method of preventing the scrapping of semiconductor substrates due to improper deposition of thin films in a thin film vaporization system.

These objects are accomplished by providing a thin film vaporization system comprising stored liquid precursors in tanks under pressure connected to a deposition chamber via a manifold which in turn is connected to pipe lines emanating from each tank and coupled to own liquid flow meters (LFMs) and injection valves (IVs); activating a servo mechanism to pump down said deposition chamber to achieve partial vacuum therein; opening a downstream throttle valve (TV) for a carrier gas to flow through said manifold to commence self-calibration; a first timing to monitor a baseline self-calibrated pressure by a predetermined TV opening which correlates with the specified baseline pressure in said deposition chamber; a second timing to allow for the stabilization of carrier gas after throttling said TV to a predetermined opening; selecting a liquid precursor and its own said respective pipe line with said own LFM and own IV connected to said deposition chamber via said manifold; setting said own IV to a predetermined opening to start said liquid precursor to flow; setting said TV opening to a normal liquid precursor flow rate for film deposition; a third timing to allow for liquid precursor flow to stabilize; a fourth timing to allow vaporization of said liquid precursor in said deposition chamber; measuring final pressure in said deposition chamber; stopping the flow of said precursor fluid; and pumping down said deposition chamber to continue with said film deposition pending the result of said pressure rise.

BRIEF DESCRIPTION OF THE DRAWINGS

FIG. 5 is Table III showing the various steps used in self-calibrating and testing of TEOS liquid precursor flow and vaporization, according to the present invention.

DESCRIPTION OF THE PREFERRED EMBODIMENTS

Figure 1:
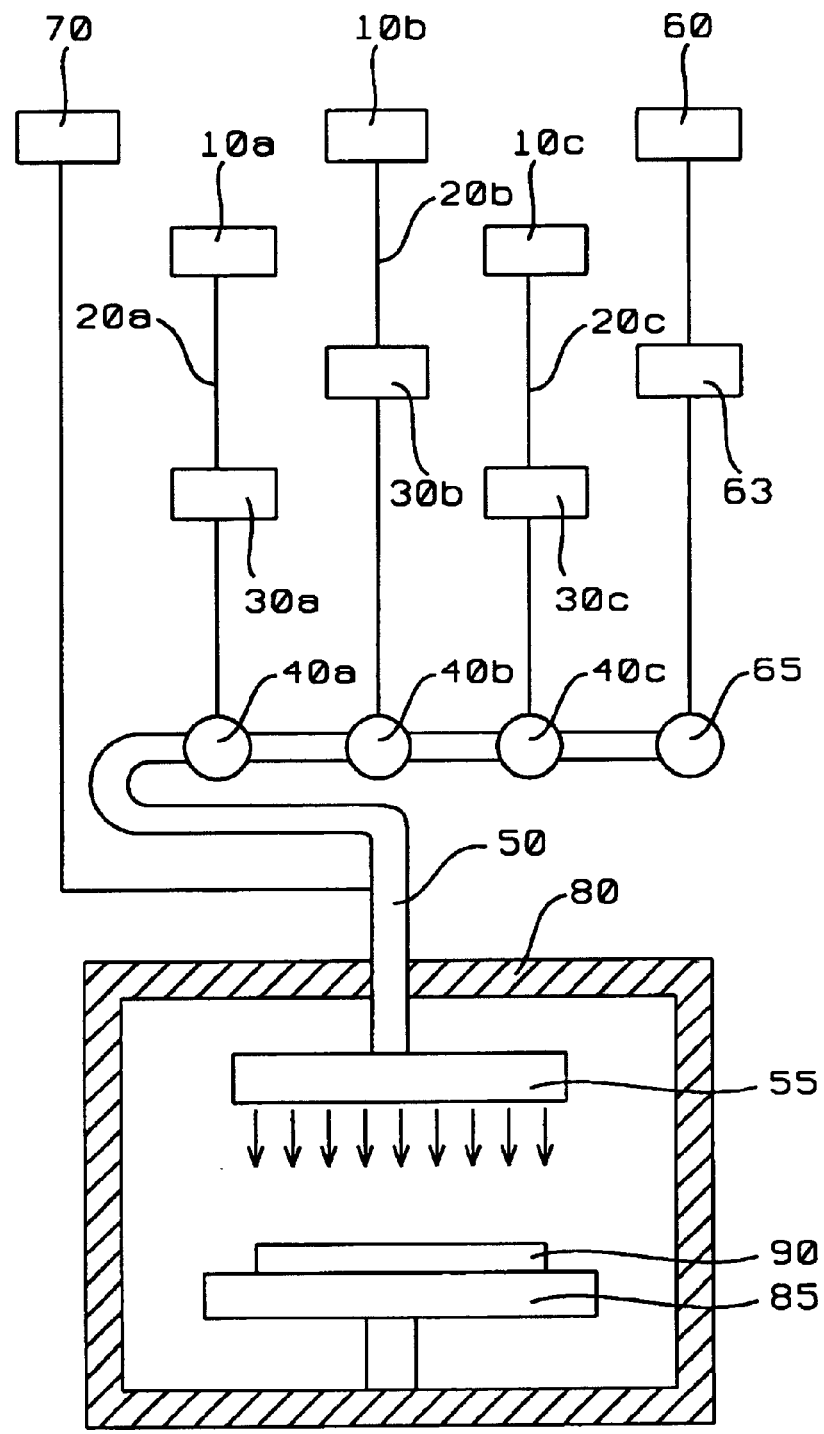
FIG. 1 is a vaporization system used in the deposition of thin films on wafers in a chamber, according to prior art.

Referring now to the drawings, specifically to Figs. FIGS. 2–5, there is shown a method of preventing the scrapping of semiconductor substrates due to improper deposition of thin films in a thin film vaporization system. This is accomplished by providing a method of self-calibrating and testing the flow of liquid precursors in the vaporization system prior to the start of the deposition process. The vaporization of the liquid precursor in the deposition chamber and the concomitant pressure change in the chamber is correlated with the vaporization process as monitored downstream. This correlation is then used as a real time monitoring mechanism for self-calibrating and testing the flow of liquid precursors through the vaporization system. That the pressure change due to vaporization in the chamber is used as the key parameter, the thin film deposition is hence controlled by that parameter which directly determines the film deposition characteristics.

Figure 2:
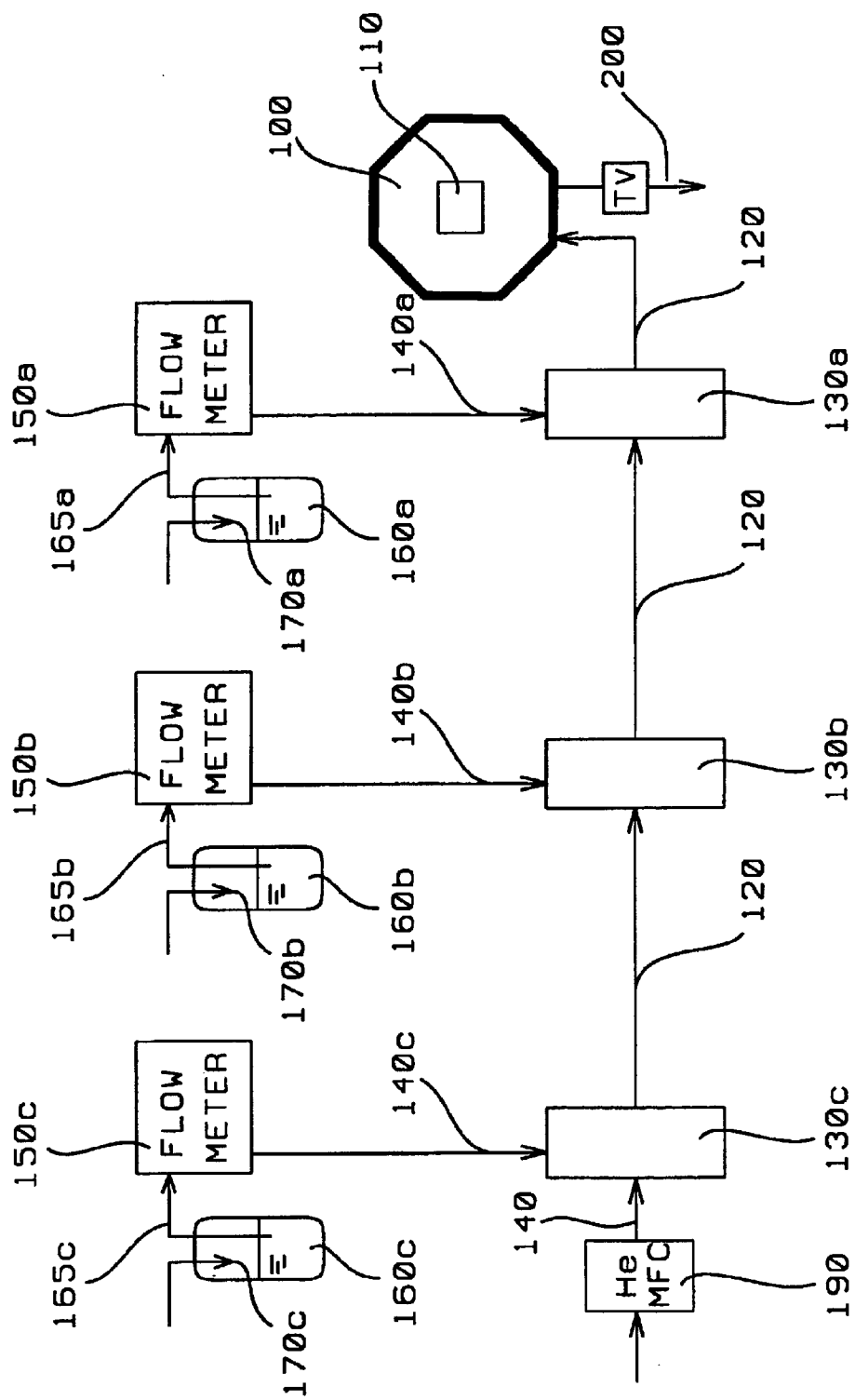
FIG. 2 is a vaporization system used in the deposition of thin films on wafers in a chamber, according to the present invention.

More specifically, FIG. 2 shows a thin film vaporization system with a serial liquid delivery arrangement connected to an AMAT TEOS-based deposition chamber (100). Wafer (110) to receive a thin film TEOS deposition is shown schematically in chamber (100). Process gases and/or vapors, from common manifold (120), enter deposition chamber (100) through a distribution nozzle or showerhead (not shown) positioned over wafer (110) in the chamber. Chamber (100) is evacuated or maintained at a subatmospheric pressure, but in any event is maintained at a lower pressure than the carrier gas and process gases and/or vapors so that the gases and vapors flow through manifold (120) in the direction of chamber (100), which is located at the end of the manifold (120). The chamber is pumped down by means of a servo mechanism evacuating the chamber via the pipe line (200) shown in the same FIG. 2.

Manifold (120) has several junctures at which fluids that are used in the thin film deposition process are admitted. In the preferred arrangement shown in FIG. 2, there are three such junctures ((130a), (130b) and (130c)) where a combination injection valve/vaporizer (IV) boxes are located. The IV is preferably a venturi tube which is commonly used for atomizing liquids. The IV boxes are also connected to individual pipe lines ((140a), (140b) and (140c)) emanating from flow meters ((150a), (150b) and (150c)) which measure the flow rates of liquid precursors that flow from their respective storage tanks ((160a), (160b) and (160c)). The liquid precursors are made to flow in their respective pipe lines ((165a), (165b) and (165c)) by pressurizing their tanks with an inert gas, such as helium, and preferably under a pressure between about 20 to 30 pounds per square inch (psi). Helium entry points into the tanks are shown by reference numerals (170a), (170b) and (170c) in FIG. 2. It will be understood that the resulting pressure differential through each tank will cause the respective liquid precursor to flow through a liquid flow meter (LFM) down the pipe line into the IV box where the fluid is vaporized as it exits the venturi tube into the manifold, and then proceeds into the deposition chamber (100).

A source of carrier gas, such as argon, nitrogen, but preferably helium, is also connected to manifold (120) through a pipe line (180) with a flow controller (MFC). It will be noted that the carrier gas enters the manifold at a point farthest away or upstream of deposition chamber (100) so that the carrier gas entering manifold (120) passes through the entire length of the manifold prior to entering the deposition chamber, (100).

In the AMAT TEOS-based vaporization system used in the present manufacturing line, liquid precursors tetraethylorthosilicate (TEOS), triethylborate (TEB), and triethyLphosphate (TEPO) are employed to deposit borophosphosilicate Glass (BPSG) thin films on wafers. Other precursors are also used to form other types of thin films. However, it has been the experience in the present manufacturing line that the quality of the liquid vaporization, that is, the amount of vaporization and hence the amount of vapor mixed with liquid, after passing the injector valves, or, IVs, and entering the deposition chamber is very critical to the forming of thin films with the required properties. Even though liquid flow meters (LFMs) provide liquid flow rate readings, because they are upstream of the IVs, they are not capable of detecting any malfunction in the liquid vaporization process downstream within the IVs. In other words, even though the liquid flow rate may be adequate, that, by itself, is not a guarantee that the vapor quality downstream the LFM is adequate for proper film thickness and uniformity to be formed on wafers in the deposition chamber. This is because the liquid vaporization is affected by the conditions of the injection valve, i.e., whether clogged or not, by liquid and valve temperatures, as it would be expected. It will be noted in passing, though not shown, that heater strips are usually employed at various sections in the IV boxes and along the manifold to control the liquid/vapor temperature. To a large extent, none of these conditions will be reflected in the liquid flow rates measured by LFMs. Therefore, without a proper monitoring system of the vaporization process, the manufacturing line experiences many unwanted wafer scraps.

It is a main feature and key aspect of the present invention to provide a means for real-time monitoring of any malfunction in the vaporization process during the deposition of thin films on wafers. The real-time monitoring that is disclosed in the instant invention relies upon a correlation between the pressure rise in the deposition chamber and the quality of the vaporization process, and hence, that of the quality of the thin film being deposited. Furthermore, the disclosed chamber pressure rise is independent of the chamber itself. Once the particular pressure level is achieved with any one of the AMAT chambers within certain range, then all of the vaporization system is ready for proper film deposition process.

Figures 3A, 3B:
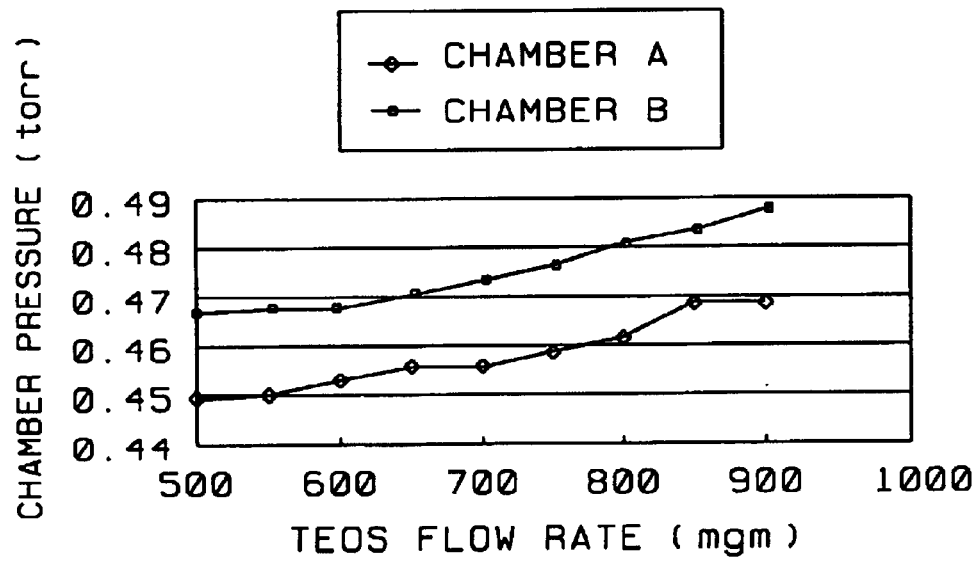
FIG. 3a is Table I showing measured values of selected parameters of a vaporization system with fully open throttle valve (TV) between the process chamber and the pumping line, according to the present invention.
FIG. 3b is a plot of the parameters of FIG. 3a, according to the present invention.
Figures 4A, 4B:
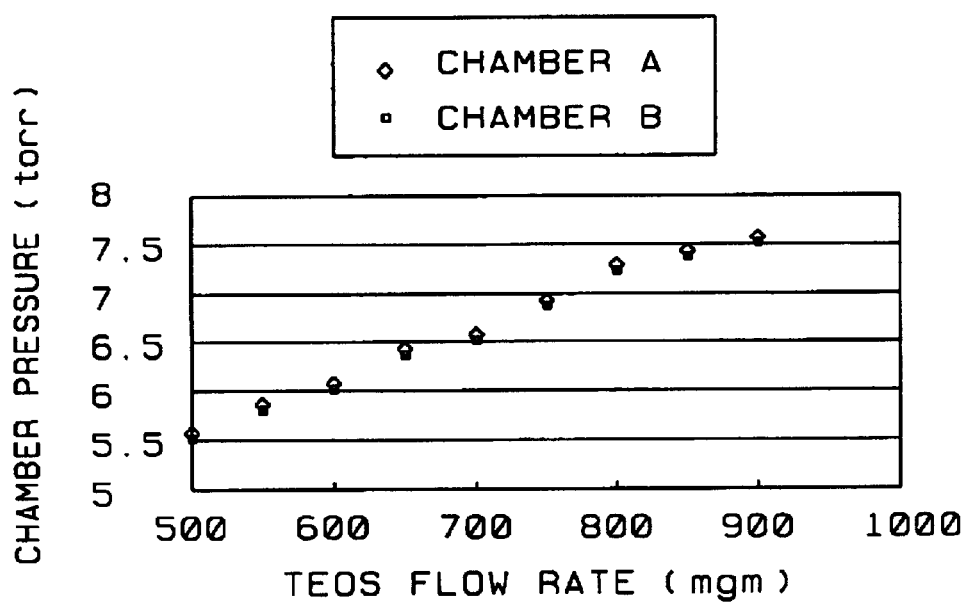
FIG. 4a is Table II showing measured values of selected parameters of a vaporization system with "self-calibrated" TV opening, according to the present invention.
FIG. 4b is a plot of the parameters of FIG. 4a, according to the present invention.

These results are shown in FIGS. 3a–3b and FIGS. 4a–4b, with a major difference between the two sets of Figures. FIG. 3b is a plot of the values measured in FIG. 3a, where the chamber pressure of two different chambers A and B are measured at the same flow rate of TEOS liquid precursor. The measurements of FIGS. 3a and 3b are made with the carrier gas helium being throttled fully open and the carrier gas flow set at 800 standard cubic centimeter per minute (sccm). (It will be noted that the flow rate of the liquids is given in units of milligram per minute (mgm)). Under those conditions, the TEOS precursor flow rate and chamber pressure vary as shown in Table I and in the plot of FIG. 3a. It will be noted that with two different chambers A and B, the flow rate is multifunctional, that is, not unique. However, experiments show, as seen in FIGS. 4a and 4b that when the throttle valve is set at a value called the "self-calibration" value, then the data points for the same two chambers coalesce, that is, the chamber pressure rise becomes unique and independent of the chamber being used. At the same time, it is found that the vaporization process is acceptable to yield uniform thin film properties. Thus, it is disclosed that when the chamber pressure reaches greater than 7.0 torr, the system is properly functional.

In the operation of a vaporization system, therefore, the system can be readied, that is, calibrated and tested, for each liquid precursor, before depositing thin films according to Table III shown in FIG. 5. It will be noted in the first column on the left of Table III, that some of the parameters that are included there are not needed during the self-calibration and test mode of the system, although they are included in the Table to indicate that they may be used during the actual thin film deposition. For example, neither radio frequency (RF) power, nor end-point (EP) selection is used other than during the actual deposition mode. It will be known that end-point detection is usually determined by fluorine concentration detector in the chamber. However, the end-point of each process step shown in FIG. 3 is predetermined by time step control as indicated in the third row of Table III, except for the important step 4 for vaporization. It is a key aspect of the present invention that the system is only acceptable for thin film deposition only after the chamber pressure reaches 7 torr, and only within a maximum time step of 5 seconds from a baseline value.

It will be noted that the time required for chamber pressure to rise to a particular value in the film deposition chamber after the introduction of vaporized TEOS liquid precursor will be dependent upon the throttle valve condition and the efficiency of the chamber pumping system. Different pumping system conditions will give rise to different duration for chamber pressure to reach 7 torr. To normalize this condition, a "self-calibration" step is incorporated to the beginning of the testing procedure where for a particular throttle valve setting and pumping system, the chamber pressure is first allowed to reach 3.0 torr, as a baseline value. Subsequently, the success of the calibration process is judged by the important $4^{th}$ step in FIG. 5. That is, whether or not the TEOS liquid flow is fully vaporized to get the chamber pressure from 3 torr to 7 torr in 5 seconds. If the vaporization is not 100% complete, the duration for the pressure rise will be less than 7 torr and longer than 5 seconds, at which time the system will send a warning message to a monitor screen or to a host system for trouble shooting. Hence, it is critical that at least an upperline of 7 torr in the chamber must be reached from a baseline of 3 torr within the times indicated in Table III of FIG. 5.

More specifically, the procedure for self-calibrating and testing the vaporization system shown in FIG. 2 starts with step 1 of Table III in FIG. 5, namely with self-calibration after having chosen any one of chambers A, B, C, D, . . . . It will be noted from the same Table that the heated fixture is spaced nominally at 290 mils from the distribution showerhead, that is, between about 250 to 350 mils, and heated nominally to 400° C. between about 350 to 450° C.; carrier gas helium is flowing nominally at 800 milligrams per minute (mgm) between about 700 to 900 mgm; no end-point (EP) detection from the chamber is used, and no RF power is turned on. In the first self-calibration mode, the chamber pressure is maintained at a nominal baseline pressure of 3 torr between about 2 to 4 torr by a special TV servo step which controls the degree of opening of the TV. The purpose for this step is to find out a baseline TV servo step which will be fixed from step 2 through step 4. This baseline TV servo step will then make chamber pressure rise independent of chamber what chamber is used. The preferred nominal time to reach the baseline pressure is 10 seconds between about 5 to 15 seconds.

At the $2^{nd}$ step, the helium surge through the throttle valve (TV) is allowed to settle, or stabilize, within a nominal time of 5 seconds between about 4 to 6 seconds. Then at the $3^{rd}$ step, TEOS liquid precursor injection valve is opened to allow a nominal flow of 900 mgm between about 800 to 1000 mgm. The settling, or stabilization time for the TEOS liquid is nominally 8 seconds between about 7 to 9 seconds.

At the next key $4^{th}$ step, the TEOS liquid vaporization is verified. If 100% vaporization takes place, then the chamber pressure rises to a nominal value of 7 torr between about 6.5 and 7.5 torr within a nominal time period of 5 seconds between about 4 to 6 seconds. Providing that this step is successful, the flow of TEOS liquid is stopped and the chamber is pumped down within the time sequences shown in Table III of FIG. 5 and the total vaporization system is readied for the actual film deposition.

If, on the other hand, the $4^{th}$ step is not successful, then the system will send a warning message to a monitor screen or to a host system for trouble shooting.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, using the self-calibration and test procedure for other liquid precursors including, but not limited to trimethylphosphite (TMP), triethylphosphite (TEP), or triethylphosphate (TEPO); and/or a liquid boron source precursor such as, for example, trimethylborate (TMB) or triethylborate (TEB).

That is, while the invention has been particularly shown and described with reference to the preferred embodiments thereof, it will be understood by those skilled in the art that various changes in form and details may be made without departing from the spirit and scope of the invention.

What is claimed is:

1. A method of self-calibrating and testing the vaporized flow of a liquid precursor in a thin film vaporization system comprising the steps of:

providing a thin film vaporization system comprising stored liquid precursors in tanks under pressure connected to a deposition chamber via a manifold which in turn is connected to pipe lines emanating from each tank and coupled to own liquid flow meters (LFMs) and injection valves (IVs);

activating a servo mechanism to pump down said deposition chamber to achieve partial vacuum therein;

opening a downstream throttle valve (TV) for a carrier gas to flow through said manifold to commence self-calibration wherein said carrier gas is a helium carrier gas;

a first timing to monitor a baseline self-calibrated pressure by a pre-determined TV opening which correlates with the specified baseline pressure in said deposition chamber;

a second timing to allow for the stabilization of carrier gas after throttling said TV to a predetermined opening;

selecting a liquid precursor and its own said respective pipe line with said own LFM and own IV connected to said deposition chamber via said manifold;

setting said own IV to a predetermined opening to start said liquid precursor to flow;

setting said TV opening to a normal liquid precursor flow rate for film deposition;

a third timing to allow for liquid precursor flow to stabilize;

a fourth timing to allow vaporization of said liquid precursor in said deposition chamber;

measuring final pressure in said deposition chamber;

stopping the flow of said precursor fluid; and pumping down said deposition chamber to continue with said film deposition pending the result of said pressure rise.

2. The method according to claim 1, wherein said tanks are pressurized by helium gas.

3. The method according to claim 2, wherein said helium gas is pressurized to between about 20 to 30 pounds per square inch gauge (psig).

4. The method according to claim 1, wherein said helium gas is kept at room temperature.

5. The method according to claim 1, wherein said manifold has heater elements.

6. The method according to claim 5, wherein said heated fixture elements are spaced nominally at 290 mils between about 250 to 350 mils from distribution shower head.

7. The method according to claim 5, wherein said heated fixture is heated nominally to 400° C. between about 350 to 450° C.

8. The method according to claim 1, wherein flow of said helium carrier gas through said manifold is between about 750 to 850 milligrams per minute (mgm).

9. The method according to claim 1, wherein said first timing is between about 5 to 15 seconds.

10. The method according to claim 1, wherein said baseline self-calibrated pressure is between about 2 to 4 torr.

11. The method according to claim 1, wherein said second timing is between about 4 to 6 seconds.

12. The method according to claim 1, wherein said liquid precursor is tetraethylorthosilicate (TEOS).

13. The method according to claim 1, wherein said liquid precursor is triethylborate (TEB).

14. The method according to claim 1, wherein said liquid precursor is tri-ethylphosphate (TEPO).

15. The method according to claim 1, wherein said injection valve (IV) comprises a venturi tube.

16. The method according to claim 1, wherein said normal liquid precursor flow rate is between about 800 to 1000 milligram per minute (mgm).

17. The method according to claim 1, wherein said third timing to allow for liquid precursor to stabilize is between about 7 to 9 seconds.

18. The method according to claim 1, wherein said fourth timing to allow for liquid precursor vaporized flow to be verified is between about 4 to 6 seconds.

19. The method according to claim 1, wherein said final pressure in said deposition chamber is between about 6.5 and 7.5 torr.

20. The method according to claim 1, wherein said pumping down said deposition chamber is accomplished within between about 9 to 11 seconds.

* * * * *